United States Patent
Sharifi Tehrani et al.

(10) Patent No.: US 11,609,857 B2
(45) Date of Patent: Mar. 21, 2023

(54) IDENTIFICATION AND CACHING OF FREQUENT READ DISTURB AGGRESSORS

(71) Applicant: Micron Technology, Inc., Boise, ID (US)

(72) Inventors: Saeed Sharifi Tehrani, San Diego, CA (US); Sivagnanam Parthasarathy, Carlsbad, CA (US); Aniryudh Reddy Durgam, San Diego, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/112,428

(22) Filed: Dec. 4, 2020

(65) Prior Publication Data
US 2022/0179795 A1 Jun. 9, 2022

(51) Int. Cl.
 *G06F 11/00* (2006.01)
 *G06F 12/0877* (2016.01)
 *G06F 11/07* (2006.01)
 *G06F 12/126* (2016.01)

(52) U.S. Cl.
 CPC ...... *G06F 12/0877* (2013.01); *G06F 11/0727* (2013.01); *G06F 12/126* (2013.01); *G06F 2212/60* (2013.01)

(58) Field of Classification Search
 CPC .................................................. G06F 11/0727
 See application file for complete search history.

(56) References Cited

U.S. PATENT DOCUMENTS

| | | | |
|---|---|---|---|
| 8,181,089 B1 | 5/2012 | Fernandes et al. | |
| 8,291,295 B2 | 10/2012 | Harari et al. | |
| 8,661,218 B1 | 2/2014 | Piszczek et al. | |
| 9,053,808 B2 | 6/2015 | Sprouse et al. | |
| 10,950,292 B1 | 3/2021 | Seyedzadehdelcheh et al. | |
| 2002/0145916 A1* | 10/2002 | Chevallier | G11C 16/3431 365/185.33 |
| 2006/0233020 A1* | 10/2006 | Ruby | G11C 16/3418 365/185.2 |
| 2007/0159887 A1* | 7/2007 | Shih | G11C 16/3427 365/185.24 |
| 2008/0256427 A1 | 10/2008 | He et al. | |
| 2009/0073760 A1* | 3/2009 | Betser | G11C 16/3418 365/185.18 |
| 2011/0066808 A1 | 3/2011 | Flynn et al. | |
| 2011/0239089 A1 | 9/2011 | Haratsch et al. | |
| 2013/0128666 A1 | 5/2013 | Avila et al. | |

(Continued)

OTHER PUBLICATIONS

Non-Final Office Action, U.S. Appl. No. 17/112,347, dated Feb. 18, 2022, 18 pages.

(Continued)

*Primary Examiner* — Amine Riad
(74) *Attorney, Agent, or Firm* — Nicholson De Vos Webster & Elliott LLP

(57) ABSTRACT

Exemplary methods, apparatuses, and systems include receiving a read operation directed to an aggressor location. An integrity scan of a victim location of the aggressor location is performed to determine an error value for the victim location. Data from the aggressor location is copied to a cache in response to determining the error value for the victim location satisfies a first error value threshold. The cache is a different type of memory from the aggressor location.

20 Claims, 5 Drawing Sheets

(56) References Cited

U.S. PATENT DOCUMENTS

| | | | |
|---|---|---|---|
| 2013/0173989 A1 | 7/2013 | Chung et al. | |
| 2013/0238955 A1 | 9/2013 | D'Abreu et al. | |
| 2015/0161036 A1 | 6/2015 | Camp et al. | |
| 2016/0124679 A1 | 5/2016 | Huang et al. | |
| 2016/0188208 A1 | 6/2016 | Kim et al. | |
| 2017/0287544 A1* | 10/2017 | Hedden | G11C 29/76 |
| 2018/0039535 A1* | 2/2018 | Sharifi Tehrani | G06F 16/90339 |
| 2018/0190362 A1 | 7/2018 | Barndt et al. | |
| 2019/0279735 A1* | 9/2019 | Zeng | G11C 11/5642 |
| 2020/0066342 A1* | 2/2020 | Ha | G11C 29/52 |
| 2020/0233739 A1* | 7/2020 | Oh | G06F 11/1048 |
| 2021/0034274 A1 | 2/2021 | Muchherla et al. | |
| 2021/0089385 A1* | 3/2021 | Basuta | G06F 11/1048 |
| 2021/0118519 A1* | 4/2021 | Muchherla | G11C 29/4401 |
| 2022/0164113 A1 | 5/2022 | Hope et al. | |
| 2022/0180955 A1 | 6/2022 | Sharifi | |

OTHER PUBLICATIONS

Notice of Allowance, U.S. Appl. No. 16/846,974, dated Feb. 16, 2022, 8 pages.

Requirement for Restriction/Election, U.S. Appl. No. 16/846,974, dated Sep. 28, 2021, 6 pages.

Notice of Allowance, U.S. Appl. No. 17/112,347, dated Jun. 6, 2022, 23 pages.

Notice of Allowance, U.S. Appl. No. 17/112,014, dated Apr. 7, 2022, 8 pages.

Non-Final Office Action, U.S. Appl. No. 17/112,271, dated Aug. 30, 2022, 7 pages.

* cited by examiner

IDENTIFICATION AND CACHING OF FREQUENT READ DISTURB AGGRESSORS

TECHNICAL FIELD

The present disclosure generally relates to the mitigation of read disturb errors in a memory subsystem, and more specifically, relates to identifying and caching frequent read disturb aggressors.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
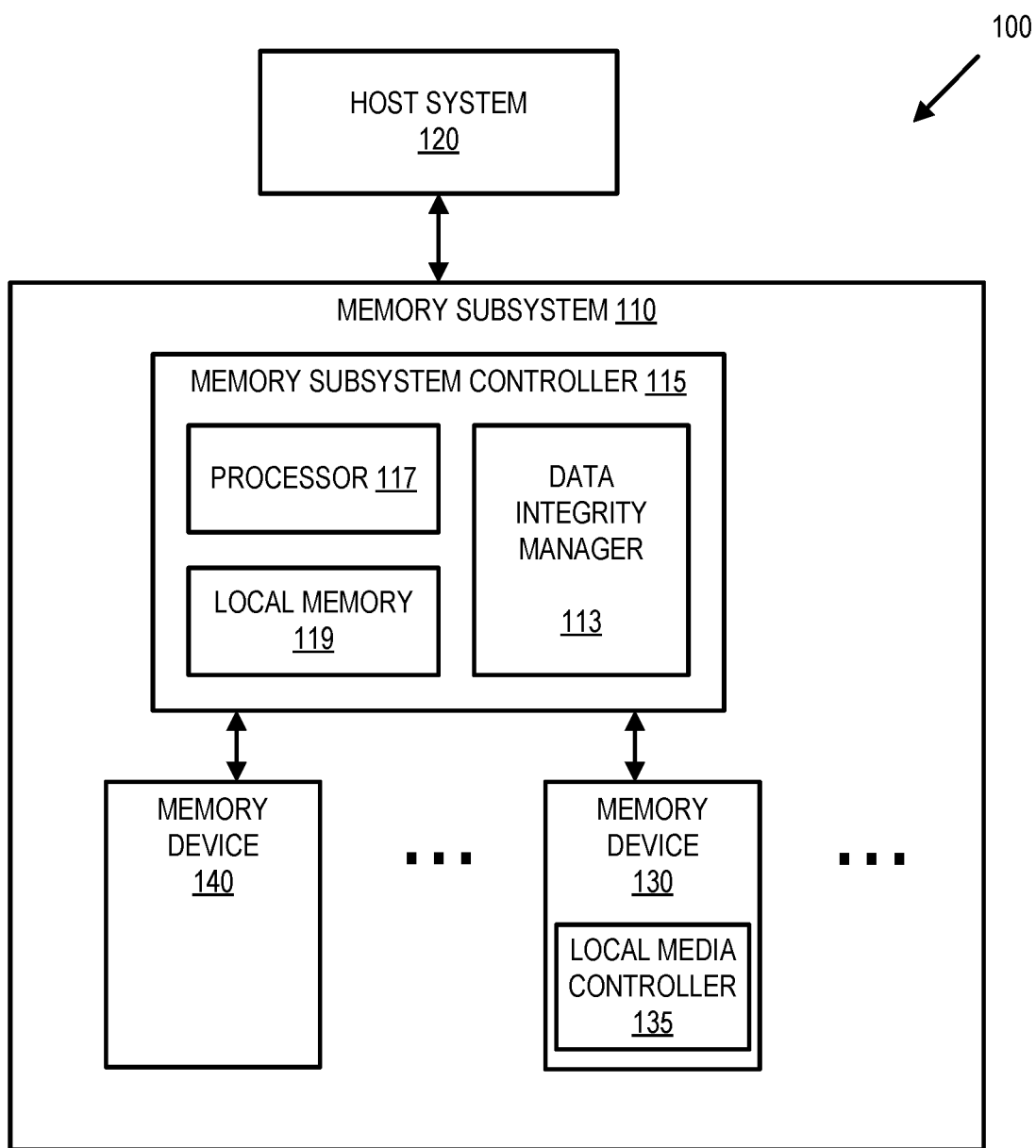
FIG. 1 illustrates an example computing system that includes a memory subsystem in accordance with some embodiments of the present disclosure.

Aspects of the present disclosure are directed to identifying and caching frequent read disturb aggressors in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Data reliability in a memory can degrade as the memory device increases in density (e.g., device components scale down in size, when multiple bits are programmed per cell, etc.). One contributor to this reduction in reliability is read disturb. Read disturb occurs when a read operation performed on one portion of the memory (e.g., a row of cells), often referred to as the aggressor, impacts the threshold voltages in another portion of memory (e.g., a neighboring row of cells), often referred to as the victim. Memory devices typically have a finite tolerance for these disturbances. A sufficient amount of read disturb effects, such as a threshold number of read operations performed on neighboring aggressor cells, can change the victim cells in the other/unread portion of memory to different logical states than originally programmed, which results in errors.

A memory system can track read disturb by using counters per subdivision of memory and reprogramming a given subdivision of memory when the counter reaches a threshold value. A probabilistic data integrity scheme consumes less resources and reduces the number of integrity scans by counting or otherwise tracking sets of read operations in a portion of memory (e.g., a chip, logical unit, etc.) and performing a limited data integrity scan by checking the error rate of one or more read disturb victims of a randomly selected read operation in each set. The tendency for such a scheme to select highly accessed locations, however, can lead to repetitive data integrity scans. For example, a row hammer test repeatedly accesses (hammering) a portion of memory, such as a word line, to test the reliability of that portion of memory, the impact of read disturb on victims of that portion of memory as an aggressor, etc. A row hammer test or similar localized read pattern can trigger a probabilistic data integrity scheme to unnecessarily read victims to check the error rate of the victims of frequent aggressors repeatedly, e.g., while the victims are not at risk of exceeding a threshold error rate. Unnecessarily checking the error rate of one or more victims can result in contributing to additional read disturb effects as well as a collision with a host read and the corresponding compromise in quality of service for the host system. Additionally, a row hammer test or similar localized read pattern can result in significant read disturb for one or more victim locations.

Aspects of the present disclosure address the above and other deficiencies by implementing a probabilistic data integrity scheme while identifying and caching frequent read disturb aggressors. For example, some embodiments mitigate read disturb by copying or migrating data for a frequent aggressor read operation to a cache and using the cache to service subsequent read operations for the aggressor. As a result, the memory subsystem can mitigate some read disturb impacts of frequent aggressors and the corresponding integrity checks of the victims of the aggressor location(s). By caching frequent read disturb aggressors, the memory subsystem increases the effective read tolerance of the memory (with respect to read disturb) before triggering a fold or other migration of victim data. The corresponding reduction in data migration due to read disturb improves the memory subsystem's quality of service.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a data integrity manager 113 that mitigates read disturb errors. In some embodiments, the controller 115 includes at least a portion of the data integrity manager 113. For example, the controller 115 can include a processor 117 (processing device) configured to execute instructions stored in local memory 119 for performing the operations described herein. In some embodiments, a data integrity manager 113 is part of the host system 120, an application, or an operating system.

The data integrity manager 113 can implement and manage a read disturb mitigation scheme. For example, the data integrity manager 113 can implement a probabilistic read disturb mitigation scheme that includes identifying and caching frequent read disturb aggressors. Further details with regards to the operations of the data integrity manager 113 are described below.

Figure 2:
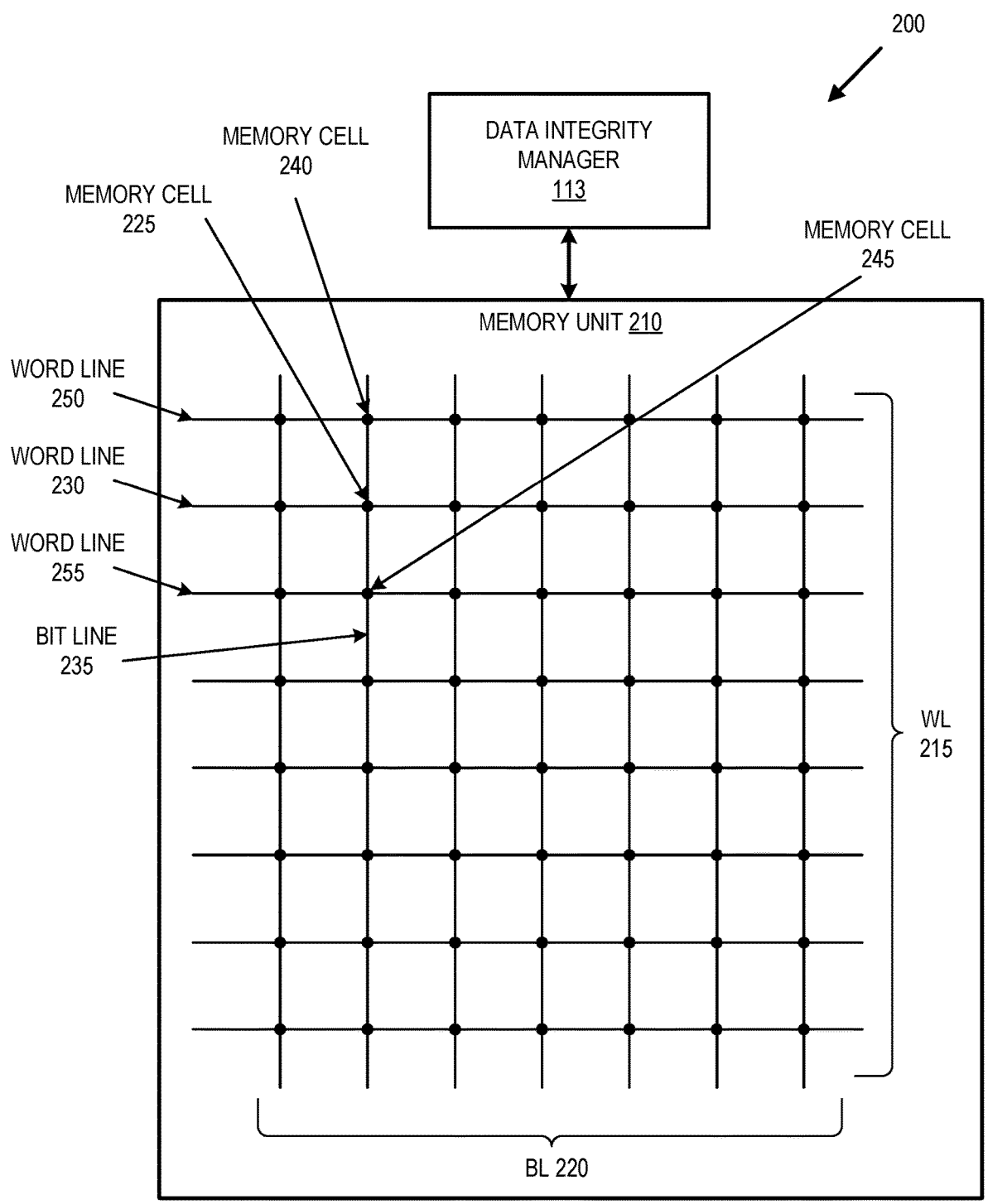
FIG. 2 illustrates an example of managing a portion of a memory subsystem in accordance with some embodiments of the present disclosure.

FIG. 2 illustrates an example of managing a portion of a memory subsystem 200 in accordance with some embodiments of the present disclosure. In one embodiment, the data integrity manager 113 implements a read disturb mitigation scheme per memory unit 210 or another division of memory. For example, the data integrity manager 113 can perform a separate probabilistic read disturb mitigation scheme per LUN, type of memory cells (e.g., SLC, MLC, TLC, etc.), etc.

The illustration of the memory unit 210 includes an array of memory cells. The memory 210 illustrates a small number of memory cells for the sake of providing a simple explanation. Embodiments of the memory unit 210 can include far greater numbers of memory cells.

Each memory unit 210 includes memory cells that the memory subsystem 110 accesses via word lines 215 and bit lines 220. For example, a memory device 130 can read a page of memory using word line 230. Within that page, memory cell 225 is accessed via word line 230 and bit line 235. As described above, reading a memory cell can result in read disturb effects on other memory cells. For example, a read of memory cell 225 (the aggressor) can result in disturbing memory cells 240 and 245 (the victims). Similarly, a read of other memory cells of word line 230 (the aggressor) can result in disturbing other memory cells of word lines 250 and 255 (the victims).

This disturb effect can increase the error rate for victim memory cells. In one embodiment, the data integrity manager 113 measures the error rate of a portion of memory as a raw bit error rate (RBER). The data integrity manager 113 can track and mitigate read disturb by tracking read operation traffic in the memory unit 210 and checking the error rate of victim(s). For example, the data integrity manager 113 can select a read operation directed to word line 230 as the aggressor for testing read disturb and perform a read of word lines 250 and 255 to determine the error rate of each. In response to detecting an error rate of a given victim portion of memory satisfying a threshold error rate value, the data integrity manager 113 can migrate data from the victim portion of memory to different portion of memory. In particular, the data integrity manager 113 identifies and caches frequent read disturb aggressors. This tracking and mitigation of read disturb is described further with reference to FIGS. 3 and 4.

Figure 3:
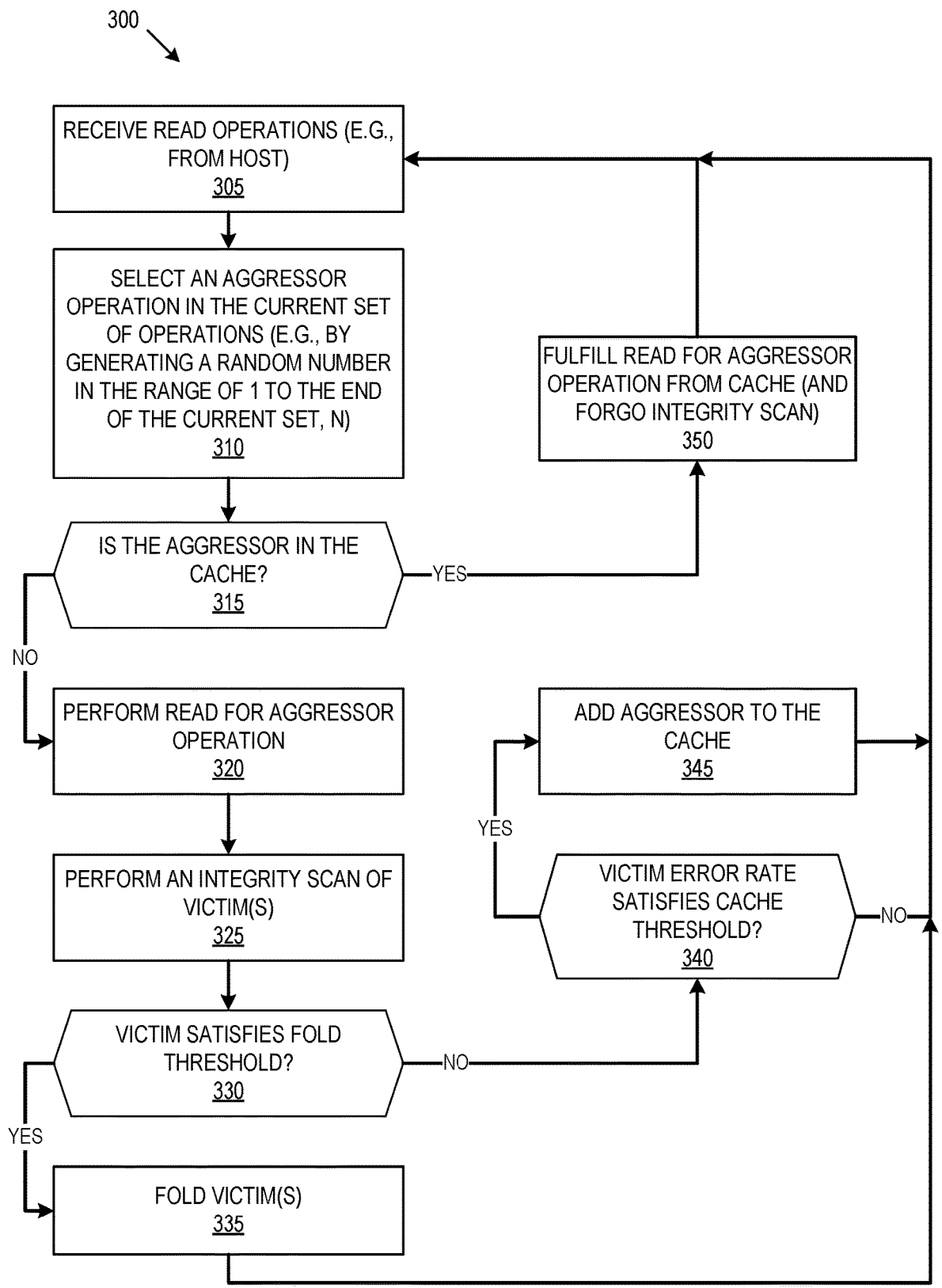
FIG. 3 is a flow diagram of an example method to identify and cache frequent read disturb aggressors in accordance with some embodiments of the present disclosure.

FIG. 3 is a flow diagram of an example method to identify and cache frequent read disturb aggressors in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives read operation requests. Read requests can be received from one or more host systems and/or generated by another process within the memory subsystem 110. The processing device can receive read operation requests asynchronously, continuously, in batches, etc. In one embodiment, the memory subsystem 110 receives operation requests from one or more host systems 120 and stores those requests in a command queue. The processing device can process the read operations, from the command queue and/or as internally generated, in sets of N operations.

At operation 310, the processing device selects an aggressor operation in the current set of operations. When implementing a probabilistic read disturb handling scheme, the processing device can select an aggressor in the current set by generating a first random number (e.g., a uniform random number) in the range of 1 to N and, when the count of read operations in the current set reaches the first random number, identifying the current/last read operation as the aggressor.

In one embodiment, the processing device selects an aggressor operation in each of multiple separately tracked sets of operations. For example, the processing device can track read disturb distinctly within different divisions of memory (e.g., LUN's), types of memory (e.g., different memory densities), different states of programming (e.g., partial blocks vs. full blocks), different degradation factors (e.g., program erase cycles), etc. The processing device can manage each distinct portion of memory using a different number of operations, N, per set, different thresholds (e.g., error rate thresholds), different caches (e.g., different allocations of cache size), etc. As such, the processing device can select one or more of such values dynamically based upon the characteristics of the corresponding portion of memory. For the sake of explanation, the description of the method 300 will focus on one portion of memory subject to read disturb mitigation.

At operation 315, the processing device determines if the aggressor is in a cache. For example, the processing device can use a logical or physical address as an identifier of the aggressor location and determine if the aggressor's address maps to the cache. The processing device can implement cache mappings in a table or other data structure. For example, the processing device can maintain a list of aggressor identifiers in a first cache in volatile memory (such as RAM) with each aggressor identifier mapping to the corresponding aggressor data stored in another cache in volatile memory (such as RAM) or non-volatile memory (such as a portion of SLC memory). The processing device can use other values as identifiers of aggressors for mapping, e.g., a word line number, block number, etc.

If the processing device does not locate the aggressor in the cache, the method 300 proceeds to operation 320 to perform a read operation of the aggressor location. If the processing device locates the aggressor in the cache, the method 300 proceeds to operation 350 to perform the read operation using the cache.

At operation 320, the processing device performs the read operation of the selected aggressor. For example, the memory subsystem 110 performs one or more read operations in the sequence of operations in the current set of N operations. Upon reaching the selected aggressor, the memory subsystem 110 reads a page of data by accessing the memory cells along a word line and returning the data to the host system 120 or internal process that initiated the read request. Some embodiments execute read operations on other sizes/portions of memory per operation.

At operation 325, the processing device performs an integrity scan of the victim(s) of the aggressor selected for the current set of read operations. For example, in response to the selection of the aggressor in the current set, the processing device can execute a read of each victim to check the error rate of the victim of the randomly-selected aggressor read operation. The processing device can use a percentage of bits in error, a number of bits in error, or another indication of bits in error as the error rate. Alternatively, the processing device can use another error value, such as an amount of shift in a threshold voltage of the victim(s).

At operation 330, the processing device determines if the error value of the victim(s) satisfies a fold threshold. For example, the processing device can determine if the error rate of a victim meets or exceeds an error rate threshold for folding. As described above, the error rate threshold can be a dynamic value selected by the processing device, e.g., based on a characteristic of the portion of memory in which the victim is located. If a victim error rate satisfies the fold threshold, the method 300 proceeds to operation 335. If a victim error rate does not satisfy the fold threshold, the method 300 proceeds to operation 340.

At operation 335, in response to detecting an error value satisfies the fold threshold, the processing device folds or otherwise migrates data from the victim portion of memory to different portion of memory to mitigate the impact of read disturb on the victim. In one embodiment, the processing device folds or otherwise migrates the victim data to another portion of memory of the same memory type as the victim location.

In one embodiment, the processing device determines if the fold operation migrates data for a previously cached aggressor. If the processing device determines that a cached aggressor is subject to a folder operation (or other migration), the processing device evicts that aggressor from the cache.

If there are remaining read operations in the current set, the processing device can continue execution of the remaining read operations. Otherwise, the method 300 proceeds to operation 305 to receive and process additional read operations in subsequent sets.

At operation 340, the processing device determines if the error value of the victim(s) satisfy a cache threshold. For example, the processing device can determine if the error rate of a victim meets or exceeds the cache error rate threshold or if a victim otherwise satisfies the cache threshold. In one embodiment, the cache threshold represents a lower error rate (i.e., less errors) than the fold threshold. Similar to the fold threshold, the cache threshold can be a dynamic value selected by the processing device, e.g., based on a characteristic of the portion of memory in which the victim is located.

As described above, the processing device can use another metric as the cache threshold. For example, the processing device can evaluate a threshold voltage distribution of the victim(s). If the voltage distribution of a victim differs from an expected value by a threshold amount, the victim satisfies the cache threshold value. If a victim error value satisfies the cache threshold, the method 300 proceeds to operation 345 to add the aggressor to the cache. In one embodiment, the processing device uses another trigger (e.g., in addition to or as an alternative to a cache threshold value) to determine if the aggressor is to be added to the cache. For example, the processing device can use a primary cache of aggressor identifiers to detect frequent aggressors. Prior to be determined to be a frequent aggressor, the processing device maintains the aggressor data in its original memory location. Upon one or more hits of the aggressor identifier in the primary cache, the processing device can copy the aggressor data (and aggressor identifier) to a secondary cache, as described below with reference to operation 345.

If a victim error value does not satisfy the cache threshold, the processing device can continue execution of any remaining read operations and the method 300 proceeds to operation 305 to receive and process additional read operations in subsequent sets.

At operation 345, in response to the victim error value satisfying the cache threshold, the processing device adds the aggressor to the cache. For example, the processing device can save a copy of the data read in operation 320 to the cache or reread the aggressor location and copy the data to the cache. In one embodiment, the processing device stores the victim error value along with the data from the aggressor location in the cache.

If the cache is full, the processing device can implement a cache management policy to select a cache entry for eviction. In one embodiment, the cache management policy evicts an oldest entry (i.e., a first in, first out (FIFO) policy). In another embodiment, the cache management policy uses another criterion for eviction, e.g., the cache entry with the highest victim error value. While described simply as a cache, the processing device can track aggressors in various types of data structures and different types of caches. For example, the processing device can use a fully associative cache, a set-associative cache, a direct-mapped cache, or a probabilistic data structure such as a Bloom filter or cuckoo filter.

In one embodiment, the processing device creates or updates a mapping of an identifier for the aggressor location to indicate that the aggressor location data is copied to the cache. For example, the processing device can map a logical or physical address or other identifying number or value of the aggressor portion of memory to the cache entry storing the copy of the aggressor location data.

In one embodiment, the cache is a different type of memory than the aggressor or victim memory location. For example, the cache can be volatile memory (e.g., RAM) while the aggressor memory location is non-volatile memory. The processing device can fulfill repeated read operations from a volatile memory cache without concern for read disturb. In another example, the cache and aggressor memory location are both non-volatile memory but of different bit densities. In such an embodiment, the cache can be implemented using a portion of SLC memory reserved or otherwise allocated to the cache while the aggressor memory location is within an MLC, TLC, or QLC portion of memory. While an SLC cache will be subject to read disturb, SLC memory can tolerate more read disturb than a higher density portion of memory, such as MLC, TLC, or QLC.

At operation 350, in response to detecting a read operation directed to a cached aggressor location, the processing device fulfills the read operation using the cached data. As a result, the processing device can avoid causing additional read disturb for the memory location(s) that are victims of the aggressor location. Additionally, in some embodiments, the processing device can forgo an integrity scan of the victim location(s) in the current set of operations. For example, when aggressor data is stored in a volatile memory cache, the processing device can fulfill the read operation without concern for read disturb and avoiding the possibility of triggering a data integrity scan. When the aggressor data is cached in a different bit density portion of non-volatile memory (e.g., a portion of SLC memory), a read of the cache can still trigger a data integrity scan. For example, the processing device can implement a similar read disturb mitigation scheme for the non-volatile cache portion of memory and perform a data integrity scan of victims of cache reads accordingly. Because lower density portions of memory, such as portions of SLC memory, can tolerate more read disturb than a higher density portion of memory, such as MLC, TLC, or QLC, the processing device can perform data integrity scans less often (e.g., by using a larger value of N) than when the data is stored in the higher density portion of memory. Using the lower density portion of memory as a cache also results in fewer events that trigger folding or otherwise migrating victim data than when stored in higher density portions of memory.

In one embodiment, the processing device performs no integrity scan for the current set as a result of forgoing the integrity scan of the victim(s) of the aggressor in the current set of operations. In another embodiment, the processing device can replace the integrity scan of the victim(s) of the aggressor with an integrity scan of another location of memory, such as the victim(s) of another read operation in the current set.

The method 300 can continue execution of any read operations remaining in the current set and proceed to operation 305 to receive and process additional read operations in subsequent sets.

Figure 4:
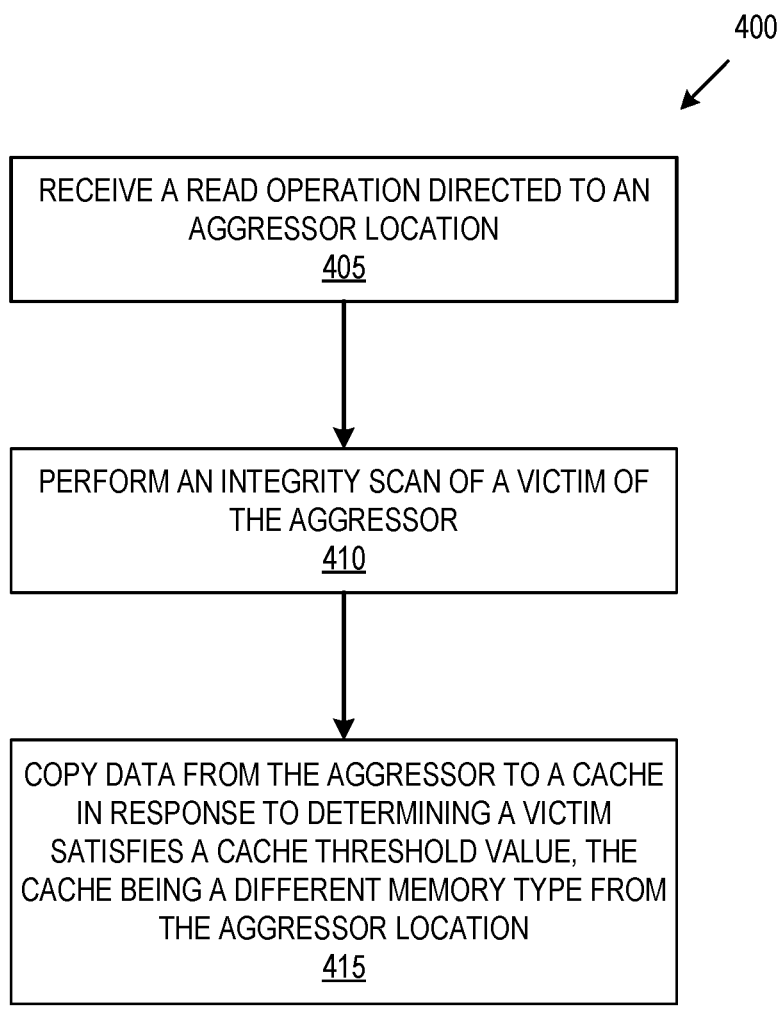
FIG. 4 is flow diagram of another example method to identify and cache frequent read disturb aggressors in accordance with some embodiments of the present disclosure.

FIG. 4 is a flow diagram of another example method 400 to identify and cache frequent read disturb aggressors in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives a read operation directed to an aggressor location in memory. For example, the processing device can select an aggressor read operation with a set of N operations, as described with reference to operation 305.

At operation 410, the processing device performs a data integrity scan of the victim(s) of the aggressor read operation. For example, the processing device can execute a read of each victim to check the error value of the victim as described with reference to operation 325.

At operation 415, the processing device copies data from the aggressor location to a cache in response to determining the error value of the victim satisfies a cache threshold value. For example, the processing device can determine the error value of a victim meets or exceeds the cache error value threshold and copy the aggressor location data to the cache as described with reference to operations 340-345. As described above, the cache can be a different type of memory than the aggressor or victim memory location.

Figure 5:
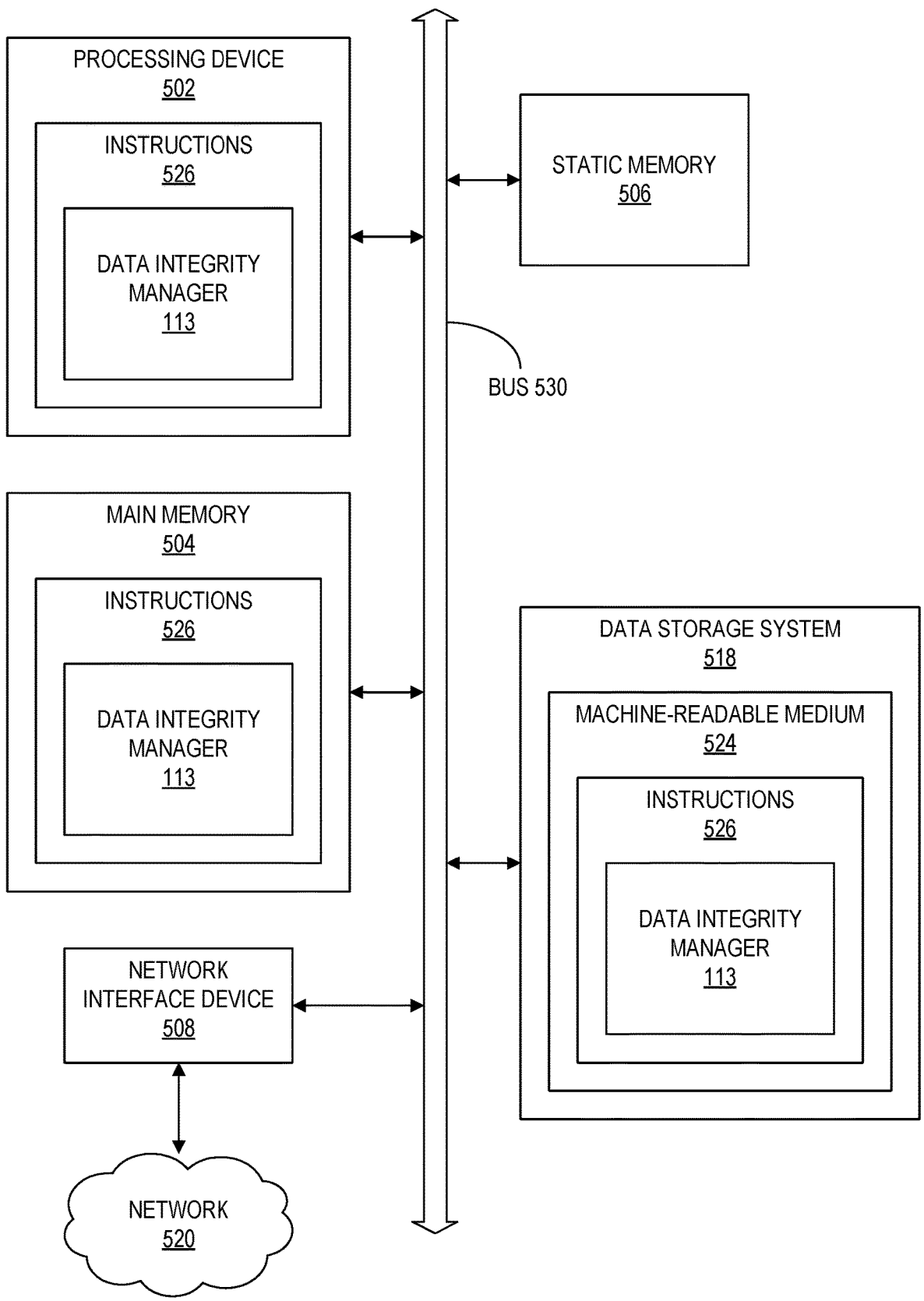
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the data integrity manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a data integrity manager (e.g., the data integrity manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving a read operation directed to an aggressor location;
   performing an integrity scan of a victim location of the aggressor location to determine an error value for the victim location; and
   copying data from the aggressor location to a cache in response to determining the error value for the victim location satisfies a first error value threshold, wherein the cache is a different type of memory from the aggressor location.

2. The method of claim 1, wherein the copying the data to the cache is further in response to determining that the error value for the victim location does not satisfy a second error value threshold, wherein data is migrated to another location when the second error value threshold is satisfied.

3. The method of claim 1, the receiving of the read operation further comprising:
   receiving a plurality of read operations, the plurality of read operations divided into a current set of read operations and one or more subsequent sets of read operations; and
   selecting the read operation from the current set as the aggressor location for the current set, wherein the integrity scan is performed in response to selecting the read operation as the aggressor location.

4. The method of claim 3, further comprising:
   selecting the read operation from a subsequent set as the aggressor location for the subsequent set; and
   in response to determining the data from the aggressor location is in the cache, forego performance of an integrity scan for the subsequent set.

5. The method of claim 1, wherein the cache is a single-level cell portion of memory reserved for cache aggressor location data and wherein the aggressor location is a portion of memory that has greater bit density than the single-level cell portion of memory.

6. The method of claim 1, the copying of data to the cache comprising:
   determining the cache is full;
   selecting a cache entry having a lowest victim error value of entries in the cache; and
   evicting the selected cache entry.

7. The method of claim 1, further comprising:
   receiving a subsequent read operation directed to the aggressor location; and
   in response to determining the data from the aggressor location is in the cache, fulfilling the read operation using the data from the aggressor location in the cache.

8. A non-transitory computer-readable storage medium comprising instructions that, when executed by a processing device, cause the processing device to:
   receive a read operation directed to an aggressor location;
   perform an integrity scan of a victim location of the aggressor location to determine an error value for the victim location; and
   copy data from the aggressor location to a cache in response to determining the error value for the victim location satisfies a first error value threshold, wherein the cache is a different type of memory from the aggressor location.

9. The non-transitory computer-readable storage medium of claim 8, wherein the copying the data to the cache is further in response to determining that the error value for the victim location does not satisfy a second error value threshold, wherein data is migrated to another location when the second error value threshold is satisfied.

10. The non-transitory computer-readable storage medium of claim 8, wherein the processing device is further to:
   receive a plurality of read operations, the plurality of read operations divided into a current set of read operations and one or more subsequent sets of read operations; and
   select the read operation from the current set as the aggressor location for the current set, wherein the integrity scan is performed in response to selecting the read operation as the aggressor location.

11. The non-transitory computer-readable storage medium of claim 10, wherein the processing device is further to:
   select the read operation from a subsequent set as the aggressor location for the subsequent set; and
   in response to determining the data from the aggressor location is in the cache, forego performance of an integrity scan for the subsequent set.

12. The non-transitory computer-readable storage medium of claim 8, wherein the cache is a single-level cell portion of memory reserved for cache aggressor location data and wherein the aggressor location is a portion of memory that has greater bit density than the single-level cell portion of memory.

13. The non-transitory computer-readable storage medium of claim 8, the copying of data to the cache comprising:
   determining the cache is full;
   selecting a cache entry having a lowest victim error value of entries in the cache; and
   evicting the selected cache entry.

14. The non-transitory computer-readable storage medium of claim 8, wherein the processing device is further to:
   receive a subsequent read operation directed to the aggressor location; and in response to determining the data from the aggressor location is in the cache, fulfill the read operation using the data from the aggressor location in the cache.

15. A system comprising:
a memory device; and
a processing device, operatively coupled with the memory device, to:
   receive a plurality of read operations, the plurality of read operations divided into a current set of read operations and one or more subsequent sets of read operations;
   select the read operation from the current set as an aggressor location for the current set;
   perform an integrity scan of a victim location of the aggressor location to determine an error value for the victim location, wherein the integrity scan is performed in response to selecting the read operation as the aggressor location; and
   copy data from the aggressor location to a cache in response to determining the error value for the victim location satisfies a first error value threshold, wherein the cache is a different type of memory from the aggressor location.

16. The system of claim 15, wherein the copying the data to the cache is further in response to determining that the error value for the victim location does not satisfy a second error value threshold, wherein data is migrated to another location when the second error value threshold is satisfied.

17. The system of claim 15, wherein the processing device is further to:
   select the read operation from a subsequent set as the aggressor location for the subsequent set; and
   in response to determining the data from the aggressor location is in the cache, forego performance of an integrity scan for the subsequent set.

18. The system of claim 15, wherein the cache is a single-level cell portion of memory reserved for cache aggressor location data and wherein the aggressor location is a portion of memory that has greater bit density than the single-level cell portion of memory.

19. The system of claim 15, the copying of data to the cache comprising:
   determining the cache is full;
   selecting a cache entry having a lowest victim error value of entries in the cache; and
   evicting the selected cache entry.

20. The system of claim 15, wherein the processing device is further to:
   receive a subsequent read operation directed to the aggressor location; and
   in response to determining the data from the aggressor location is in the cache, fulfill the read operation using the data from the aggressor location in the cache.

* * * * *